(12) United States Patent
Kaneko et al.

(10) Patent No.: US 7,476,554 B2
(45) Date of Patent: Jan. 13, 2009

(54) SUBSTRATE PROCESSING METHOD

(75) Inventors: Toshio Kaneko, Hyogo (JP); Toru Nishiwaki, Niigata (JP)

(73) Assignee: Panasonic Corporation, Osaka (JP)

( * ) Notice: Subject to any disclaimer, the term of this patent is extended or adjusted under 35 U.S.C. 154(b) by 494 days.

(21) Appl. No.: 11/389,117

(22) Filed: Mar. 27, 2006

(65) Prior Publication Data
US 2007/0004057 A1 Jan. 4, 2007

(30) Foreign Application Priority Data
Jun. 29, 2005 (JP) ............... 2005-190011

(51) Int. Cl.
H01L 21/66 (2006.01)
(52) U.S. Cl. .............. 438/14; 438/5; 438/747; 438/748; 438/800; 257/E21.521
(58) Field of Classification Search ............ 438/5, 438/14, 747, 748, 800
See application file for complete search history.

(56) References Cited

U.S. PATENT DOCUMENTS 5,939,130 A * 8/1999 Shiraishi et al. ............ 427/9
6,558,964 B2 * 5/2003 Treur ............ 438/14
6,807,455 B2 * 10/2004 Yoshida et al. ............ 700/121

FOREIGN PATENT DOCUMENTS

JP 05-135731 6/1993

OTHER PUBLICATIONS

Kawasaki, Y., et al. "The Collapse of Gate Electrode in High-Current Implanter of Batch Type" IEEE, 2004, pp. 39-41.

* cited by examiner

Primary Examiner—Zandra Smith
Assistant Examiner—Christy L Novacek
(74) Attorney, Agent, or Firm—McDermott Will & Emery LLP

(57) ABSTRACT

A substrate processing method of the present invention includes the steps of placing a substrate inside a vacuum container containing particles and processing the substrate inside the container while moving the substrate at a predetermined relative velocity of the substrate to the container. In this case, an allowable upper limit of the number or density of defects produced at the substrate due to the particles in the process for the substrate is determined, and the predetermined relative velocity is set at a value equal to or smaller than the relative velocity obtained when the number or density of defects reaches the upper limit.

16 Claims, 5 Drawing Sheets

SUBSTRATE PROCESSING METHOD

CROSS-REFERENCE TO RELATED APPLICATIONS

The disclosure of Japanese Patent Application No. 2005-190011 filed on Jun. 29, 2005 including specification, drawings and claims is incorporated herein by reference in its entirety.

BACKGROUND OF THE INVENTION (1) Field of the Invention

The present invention relates to substrate processing methods for fabrication of semiconductor integrated circuits or other purposes, and more particularly relates to substrate processing methods for processing substrates, e.g., implanting ions into substrates or cleaning substrates, while moving substrates at high speed.

(2) Description of Related Art

With a higher degree of integration of semiconductor integrated circuit devices, the sizes of gate electrodes of metal oxide semiconductor (MOS) transistors are becoming finer and finer. This reduces the physical strengths of gate electrodes, and thus gate electrodes have come to easily suffer damage due to shock.

In the case where source/drain regions of MOS transistors are formed by ion implantation, a higher degree of uniformity is demanded for the impurity profile over the wafer plane with a higher degree of integration. Furthermore, gate dielectrics reduced in thickness to approximately several nanometers due to scaling have been extremely likely to produce a dielectric breakdown due to charge-up caused by the implantation of ions into gate electrodes or implantation of ions into substrates using gate electrodes as masks.

Conventionally, in general, an impurity is introduced into a wafer by scanning the top surface of the wafer with ion beams having a narrowed diameter. The reasons for this are as follows: first, the uniformity of the impurity profile and the impurity concentration over the wafer plane is enhanced in high-current ion implantation, in particular, ion implantation for the formation of source/drain regions; and furthermore continuous application of beams to the wafer at a high ionic concentration is restrained from producing a dielectric breakdown due to charge-up and thus causing damage.

To be specific, methods for uniformly introducing an impurity into the entire surface of a wafer with ion beams having a narrow diameter include a method in which a semiconductor substrate is allowed to travel at high speed in the vertical direction to fixed incident ion beams without scanning the wafer plane with ion beams. This method is disclosed in, for example, Japanese Unexamined Patent Publication No. 5-135731.

FIG. 4A illustrates an end station part of a batch-type ion implantation apparatus using the above-mentioned method. Semiconductor substrates are placed on the end station part. As illustrated in FIG. 4A, a plurality of semiconductor substrates 11 are placed and fixed on a large-diameter disk 10, and the disk 10 can rotate about a rotational shaft 12. Such an end station part and other components are placed as a whole under a high vacuum atmosphere.

FIG. 4B illustrates the state of the end station part during ion implantation when obliquely viewed. During ion implantation, the disk 10 usually rotates at a high speed of 1000 rpm (revolutions per minute) or more. Simultaneously, the disk 10 itself linearly moves up and down. While the disk 10 is moving as described above, ion beams 13 are applied to the disk 10.

In the above-mentioned manner, the top surfaces of the semiconductor substrates 11 are uniformly scanned with the ion beams 13. As a result, an impurity is introduced generally uniformly into the semiconductor substrates 11.

SUMMARY OF THE INVENTION

However, as the pattern dimensions of semiconductor elements formed at a semiconductor integrated circuit device are becoming finer, pattern defects of a device into which an impurity is introduced using the ion implantation apparatus of FIG. 4A are increasing.

To cope with this, the present invention provides a substrate processing method that permits a process for substrates while restraining such pattern defects from increasing. This reduces the loss in production yield associated with the process for substrates and provides high-reliability semiconductor devices.

The present inventors' survey on the cause of the production of the previously-described pattern defects has showed that such pattern defects are caused due to particles existing in an atmosphere for processing substrates. Furthermore, it has been found that such pattern defects significantly increase, in particular, when the pattern dimensions are set at 130 nm or less. This will be described below.

In the process for substrates, the substrates move relative to a substrate processing apparatus or a substrate processing atmosphere at high speed. For example, in the use of the apparatus illustrated in FIGS. 4A and 4B, semiconductor substrates 11 fixed on a disk 10 rotate with the rotation of the disk 10 and also move up and down with the vertical movement of the disk 10. In view of the above, the semiconductor substrates 11 move relative to a container for processing a substrate at high speed.

In the above-described process for substrates, minute particles are desirably removed from a vacuum chamber (not shown) or a vacuum atmosphere (herein, particles with a diameter of approximately 0.2 µm or less are referred to as "minute particles"). However, it is extremely difficult to completely remove the minute particles from the vacuum chamber or the vacuum atmosphere.

In view of the above, minute particles existing in the vicinity of the top surfaces of the substrates 11 have a velocity relative to the substrate 11 and also a kinetic energy relative to the substrate 11. On condition that the kinetic energy is large enough, the collision of minute particles with the substrate 11 or an element pattern formed at the substrate 11 causes damage to the element pattern or the like and thus produces pattern defects.

FIGS. 5A and 5B are scanning electron microscope (SEM) photographs illustrating pattern defects found after ion implantation serving as one of process steps for processing substrates. FIG. 5A illustrates a flaw caused in a photo resist applied onto a substrate. FIG. 5B illustrates defects caused in a MOS transistor formed by etching using an approximately 0.1-µm-wide photo resist pattern as a mask after the implantation of ions from above a gate electrode with the resist left. In FIG. 5B, not only the photo resist but also a pattern of polycrystalline silicon existing immediately below the photo resist are destroyed.

Next, FIGS. 6A through 6D are diagrams for explaining the process of causing defects illustrated in FIGS. 5A and 5B. First, the process of causing defects in FIG. 5A will be described with reference to FIGS. 6A and 6B.

In FIG. 6A, a substrate 100 representing the combination of a semiconductor substrate 101 and an element pattern formed thereon is illustrated. To be specific, for example, a shallow trench isolation (STI) 102 is formed in the top surface of the semiconductor substrate 101, a $SiO_2$ film 103 is formed to cover the semiconductor substrate 101 and the STI 102, and furthermore a photo resist 104 is formed to cover the $SiO_2$ film 103. Furthermore, a minute particle 105 representing a minute piece of a silicon oxide film or a minute piece of any other material is illustrated in the vicinity of the substrate 100.

The case where ions are implanted into the substrate 100 will be described as one of processes for the substrate 100. In this case, the substrate 100 is placed in a high vacuum atmosphere and moved along the principal surface of the substrate 100 at a velocity V relative to the high vacuum atmosphere. It is assumed that the minute particle 105 travels vertically to approach the semiconductor substrate 101.

After the previously-described movement of the substrate 100 and the minute particle 105, as illustrated in FIG. 6B, the minute particle 105 relatively obliquely collides with the substrate 100. Thus, a scratch 120 is caused in such a manner that part of the photo resist 104 is cut away. Although in FIGS. 6A and 6B both lateral sides of the substrate 100 are not illustrated, the same part of the substrate 100 is illustrated. The reason why it appears that the minute particle 105 has moved along the principal surface of the substrate 100 is that the substrate 100 has moved.

Next, the process of causing a defect in FIG. 5B will be described with reference to FIGS. 6C and 6D.

In FIG. 6C, a substrate 150, i.e., the combination of a semiconductor substrate 101 and an element pattern formed thereon, is illustrated. To be specific, for example, a STI 102 is formed in the top surface of the semiconductor substrate 101, and a gate electrode 107 of polycrystalline silicon is partly formed on each of regions of the semiconductor substrate 101 defined by the STI 102 with a gate dielectric 106 interposed between the gate electrode 107 and the semiconductor substrate 101. Furthermore, a photo resist pattern 108 is formed on the gate electrode 107. A minute particle 105 representing a minute piece of a silicon oxide film or a minute piece of any other material is illustrated in the vicinity of the substrate 150.

Like the case illustrated in FIGS. 6A and 6B, when the substrate 150 is subjected to a process, such as ion implantation, the substrate 150 is moved along its principal surface at a relative velocity V. In this state, the approach of the minute particle 105 to the substrate 150 causes relatively oblique collision therebetween. As a result, for example, as illustrated in FIG. 6D, the minute particle 105 collides with a layered structure of the gate dielectric 106, the gate electrode 107 and the photo resist pattern 108, leading to the destroyed layered structure (gate pattern).

In particular, gate electrodes having a finer line than the design rule (for example, a width of 0.1 μm or less) as in recent system LSIs (large scale integration) so as to be operated at high speed reduce their physical strengths. Therefore, such gate electrodes are likely to be destroyed. In other words, gate patterns are sensitive even to a small shock.

Since the energy caused in the collision of a minute particle with a substrate is based on a kinetic energy of the minute particle relative to the substrate, it increases proportionately with the square of the velocity at which the substrate moves or the rpm of a disk on which the substrate is placed.

A substrate processing method according to a first aspect of the present invention based on the result of the above-described survey includes the steps of placing a substrate inside a vacuum container containing particles, and processing the substrate inside the container while moving the substrate at a predetermined relative velocity of the substrate to the container, wherein an allowable upper limit of the number or density of defects is determined, said defects being produced at the substrate due to the particles in the process for the substrate, and the predetermined relative velocity is set at a value equal to or smaller than the relative velocity obtained when the number or density of defects reaches the upper limit.

According to the substrate processing method of the first aspect, an allowable upper limit of the number or density of defects produced at the substrate due to particles existing in the vacuum is determined, and the upper limit of the relative velocity of the substrate to the container is determined based on the upper limit of the number or density of defects. In other words, the relative velocity obtained when the number or density of defects reaches a predetermined upper limit is determined by an experiment or the like. The substrate is processed while the substrate is moved at the above determined relative velocity or less. Thus, the number or density of defects produced at the substrate due to particles does not exceed the allowable upper limit. The density of defects is represented by the number of defects produced per unit area of the top surface of the substrate.

Defects are produced in the manner in which the top surface of the substrate is damaged due to a kinetic energy based on the relative velocity of the top surface of the substrate to particles by the collision of particles existing in the vacuum with the top surface of the substrate. Therefore, reduction in the relative velocity of the substrate to the container can reduce the kinetic energy. This can suppress the production of defects and reduce the number or density of defects.

In the substrate processing method of the first aspect, it is preferable that the container is a processing container for an ion implantation apparatus and the process is ion implantation.

Thus, when ions are implanted into the substrate using the ion implantation apparatus, the number or density of defects can be reduced to the allowable upper limit or less.

Next, a substrate processing method according to a second aspect of the present invention includes the steps of placing a substrate in an atmosphere containing particles, said atmosphere being for processing the substrate, and processing the substrate in the atmosphere while moving the substrate at a predetermined relative velocity of the substrate to the atmosphere, wherein an allowable upper limit of the number or density of defects is determined, said defects being produced at the substrate due to the particle in the process for the substrate, and the predetermined relative velocity is set at a value equal to or smaller than the relative velocity obtained when the number or density of defects reaches the upper limit.

According to the substrate processing method of the second aspect, an allowable upper limit of the number or density of defects produced at the substrate due to particles existing in the atmosphere for processing the substrate is determined, and the upper limit of the relative velocity of the substrate to the atmosphere for processing the substrate is determined based on the upper limit of the number or density of defects. In other words, the relative velocity obtained when the number or density of defects reaches a predetermined upper limit is determined by an experiment or the like. The substrate is processed while the substrate is moved at the above determined relative velocity or less. Thus, the number or density of defects produced at the substrate due to particles does not exceed the allowable upper limit.

The reason for this is that, like the substrate processing method of the first aspect, reduction in the relative velocity of the substrate to particles existing in the atmosphere for processing the substrate can make it difficult to cause damage to the substrate even when the particles collide with the substrate. This can suppress the production of defects and reduce the number or density of defects.

In the substrate processing method of the second aspect, the atmosphere is preferably gas.

In this case, when the substrate is processed in the gas, defects produced at the substrate can be reduced.

The process for the substrate is preferably drying. In this case, when the substrate is dried in the atmosphere, i.e., gas, defects produced at the substrate can be reduced.

In the substrate processing method of the second aspect, the atmosphere is preferably liquid.

In this case, when the substrate is processed in the atmosphere, i.e., liquid, defects produced at the substrate can be reduced.

The process for the substrate is preferably cleaning. In this case, when the substrate is cleaned in the liquid, defects produced at the substrate can be reduced.

The process for the substrate is preferably application of liquid onto the substrate. In this case, when liquid is applied onto the substrate in a photolithography step or any other step, defects can be restrained from being produced at the substrate. To be specific, processes for the substrate include the process of applying a liquid material of a resist or an anti-reflection film onto the substrate and then shaking the liquid off the substrate.

In the substrate processing method of the first or second aspect, it is preferable that an allowable lower limit of the uniformity of the process over the substrate is determined and the predetermined relative velocity is set at a value equal to or larger than the relative velocity obtained when the uniformity reaches the lower limit.

Reduction in the relative velocity of the substrate to the container or the atmosphere for processing the substrate reduces the uniformity of the process over the substrate. To cope with this, an allowable lower limit of the uniformity is previously determined, and the relative velocity obtained when the uniformity reaches the determined lower limit is determined. When the substrate is processed while being moved at the above-described determined relative velocity or more, this can provide allowable uniformity of the process.

In the substrate processing method of the first or second aspect, it is preferable that an island-like pattern is formed on the substrate to have a minimum pattern width larger than 0.2 μm and equal to or smaller than 1.5 μm and the relative velocity is 5 m/second through 50 m/second both inclusive.

A film forming an opening-type pattern in which openings, such as contact holes, are formed has a large area even when the pattern becomes finer and the size of the pattern is reduced. Therefore, defects due to the collision of particles hardly cause a problem. On the other hand, with the miniaturization of the pattern, the island-like pattern, such as a gate electrode, is significantly affected by damage due to the collision of particles. In view of the above, the relative velocity at which the number or density of produced defects does not exceed the upper limit need be determined based on the size of the island-like pattern formed at the substrate.

To be specific, when the relative velocity is 5 m/second through 50 m/second both inclusive on condition that an island-like pattern is formed such that its narrowest part has a width larger than 0.2 μm and equal to or smaller than 1.5 μm, the number of defects can certainly fall within the allowable upper limit.

Likewise, it is preferable that an island-like pattern is formed on the substrate to have a minimum pattern width larger than 0.13 μm and equal to or smaller than 0.2 μm and the relative velocity is 10 m/second through 34 m/second both inclusive.

Furthermore, likewise, it is preferable that an island-like pattern is formed on the substrate to have a minimum pattern width of 0.13 μm or less and the relative velocity is 10 m/second through 30 m/second both inclusive.

The above-described relationship between the pattern width and the relative velocity allows the number or density of defects produced at the substrate to fall within the allowable upper limit with reliability and certainly permits a uniform substrate process over the substrate.

As described above, according to the present invention, when a substrate is processed while being moved relative to a container or a processing atmosphere, the substrate moving velocity is set at a predetermined upper limit or less. This can suppress the production of defects due to the collision of particles. Furthermore, when the substrate moving velocity is set at a predetermined lower limit or more, this can suppress the worsening of the uniformity of a substrate process over the substrate. This reduces the loss in the production yield of semiconductor devices and provides high-reliability semiconductor devices. The present invention is useful for, in particular, the process for substrates formed with miniaturized patterns and can be utilized for the fabrication of semiconductor devices.

DETAILED DESCRIPTION OF THE INVENTION

A substrate processing method of an embodiment of the present invention will be described hereinafter with reference to the drawings.

Figure 1B:
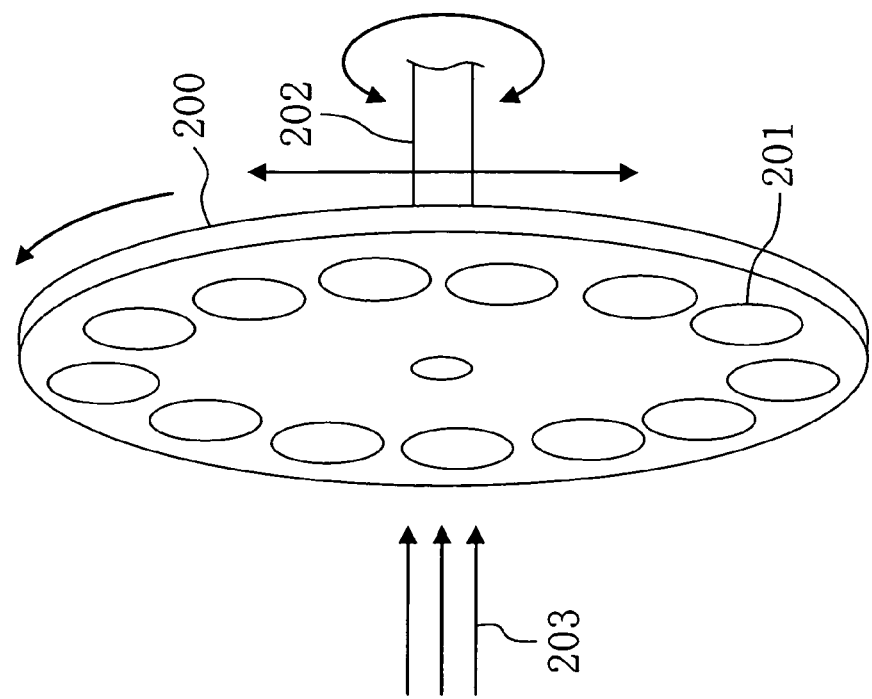
FIGS. 1A and 1B are diagrams illustrating an end station part of an ion implantation apparatus used for a substrate processing method of an embodiment of the present invention and how the end station part works.
Figure 1A:
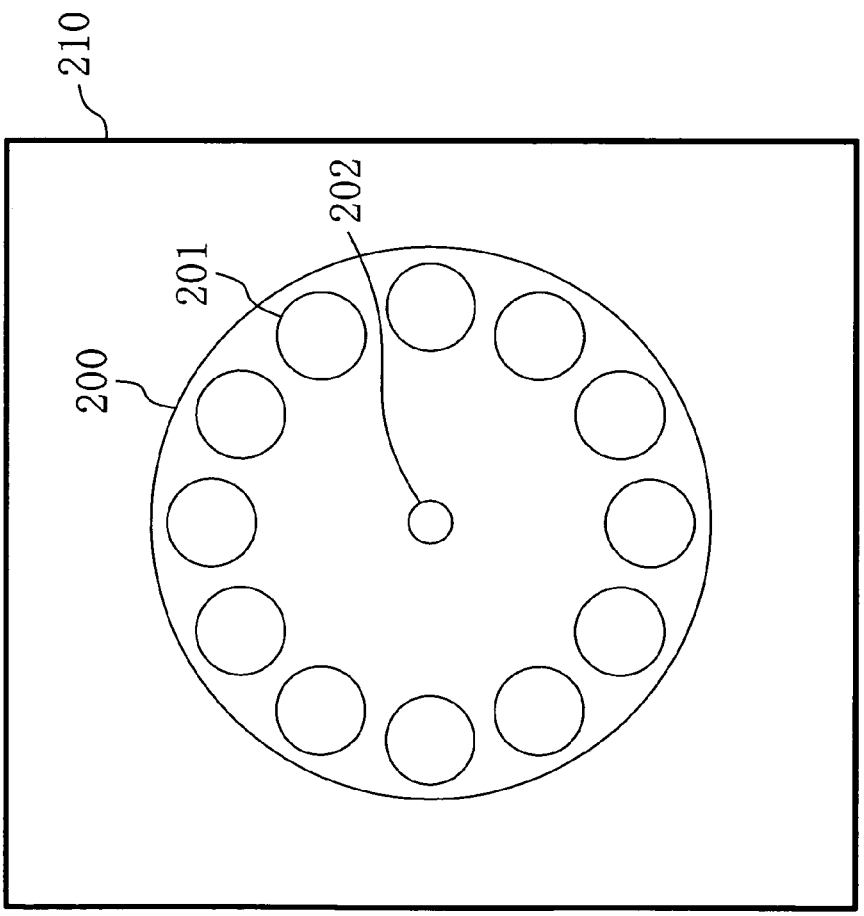

FIG. 1A is a plan view illustrating an end station part of an apparatus used for the substrate processing method of this embodiment, more specifically, an ion implantation apparatus. The end station part is placed in a processing container 210 allowed to have a high vacuum atmosphere during processing of the substrate. The apparatus is of a high-current type and a batch type, and its end station part comprises a dish-like large-diameter disk 200 on which a plurality of substrates 201 are placed so as to be fixed. The disk 200 can rotate about a rotational shaft 202 attached to its middle part.

FIG. 1B illustrates the state of the end station part during ion implantation when obliquely viewed. During ion implantation, the disk 200 is rotated at a predetermined rotation speed and linearly moved up and down. While the disk 200 is moving as described above, ions are implanted into the substrates 201 by applying ion beams 203 to the substrates 201 and uniformly scanning the top surfaces of the substrates 201. Since a processing atmosphere is a vacuum atmosphere, the relative velocity of each substrate 201 to the processing container 210 is identical with the relative velocity of the substrate 201 to the vacuum atmosphere.

Next, a description will be given of the predetermined rotational speed, i.e., the rotational speed of the disk 200 for suppressing the production of pattern defects in the substrate processing method of this embodiment. First, FIG. 2 illustrates an experimental result showing the relationship between the rotational speed of the disk 200 and the number of produced pattern defects in an ion implantation apparatus when ion implantation is carried out as one of processes for substrates.

In this experiment, a semiconductor substrate formed with 0.13-μm-wide gate electrode patterns of MOS transistors is used as a sample. The number of produced pattern defects is the number thereof per cm$^2$.

In this embodiment, the substrate 201 represents a semiconductor wafer having a diameter of 200 mm, the rpm of the disk 200 is changed from 200 to 1200, and the disk 200 linearly moves up and down at a low velocity of approximately 20 mm/second.

Figure 2:
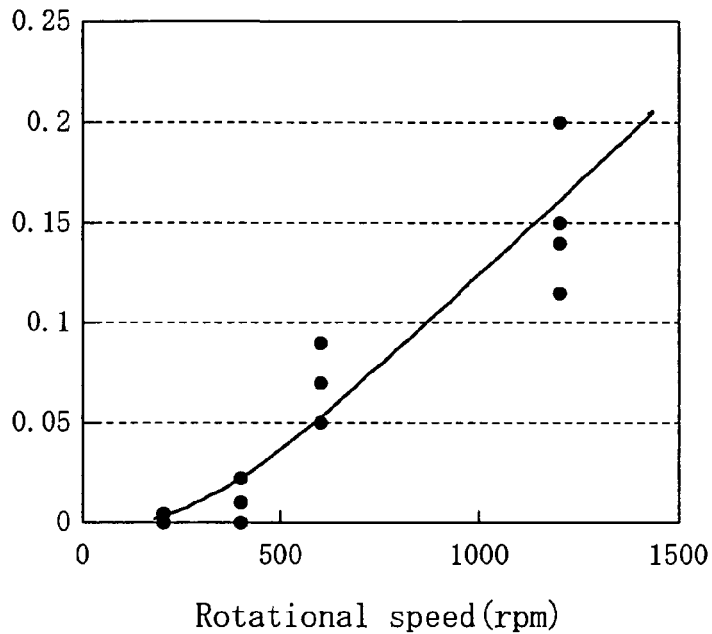
FIG. 2 is a graph for explaining the relationship between the rpm of a disk on which substrates are placed and the number of produced pattern defects in the ion implantation apparatus.

The experimental result illustrated in FIG. 2 shows that the number of produced pattern defects in a gate electrode is increasing with an increasing rotational speed of the disk 200. The reason for this is considered as follows. The higher the rpm of the disk 200 is, the kinetic energy of minute particles (for example, having a diameter of 0.2 μm or less) relative to the substrate 201 becomes larger, resulting in the increased probability of the production of defects due to damage caused to the gate electrode patterns in the collision of the particles with the substrate 201.

The result illustrated in FIG. 2 shows the following: On condition that a gate electrode has a pattern size of 0.13 μm, in order to allow the density of defects to become equal to or less than an allowable defect density of 0.05 per cm$^2$, the rpm of the disk 200 need be set at 600 rpm or less. The allowable defect density represents the defect density under which it is not considered to reduce the production yield. The above rpm of the disk 200, i.e., 600 rpm or less, corresponds to 30 m/second or less when calculated in terms of the linear velocity at which the substrate 201 moves (corresponding to the relative velocity V illustrated in FIG. 6). Such a conversion from the rpm to the linear velocity is performed in the following relational expression:

$$2\pi \cdot \text{radius of disk (m)} \cdot \text{rpm}/60 = \text{linear velocity (m/second)}$$

In this embodiment, the radius of the disk 200 is approximately 0.5 m.

As the rpm of the disk 200 or the relative velocity of the substrate 201 to the vacuum atmosphere is further reduced, the number of produced defects in the gate electrode patterns is further reduced. Especially in an example illustrated in FIG. 2, when the rpm of the disk 200 is 200 or less, the density of defects caused by the collision of minute particles is generally 0. In view of the above, the smaller the rpm of the disk 200 is, the more favorable the number of produced defects becomes.

However, in ion implantation at the production level at which semiconductor integrated circuits are fabricated, the rpm of the disk 200 has a lower limit for a different reason from the suppression of defects. This will be described below.

Figure 3:
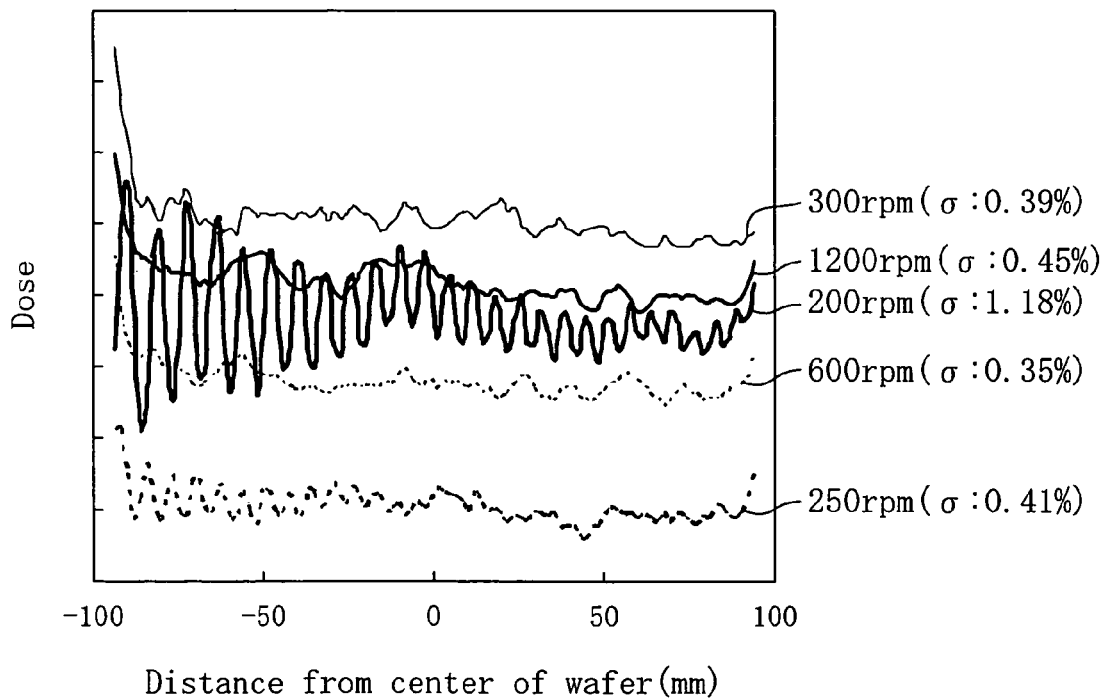
FIG. 3 is a graph illustrating the distribution of the doses of ions over the substrate corresponding to rpms of the disk during ion implantation.
Figure 4B:
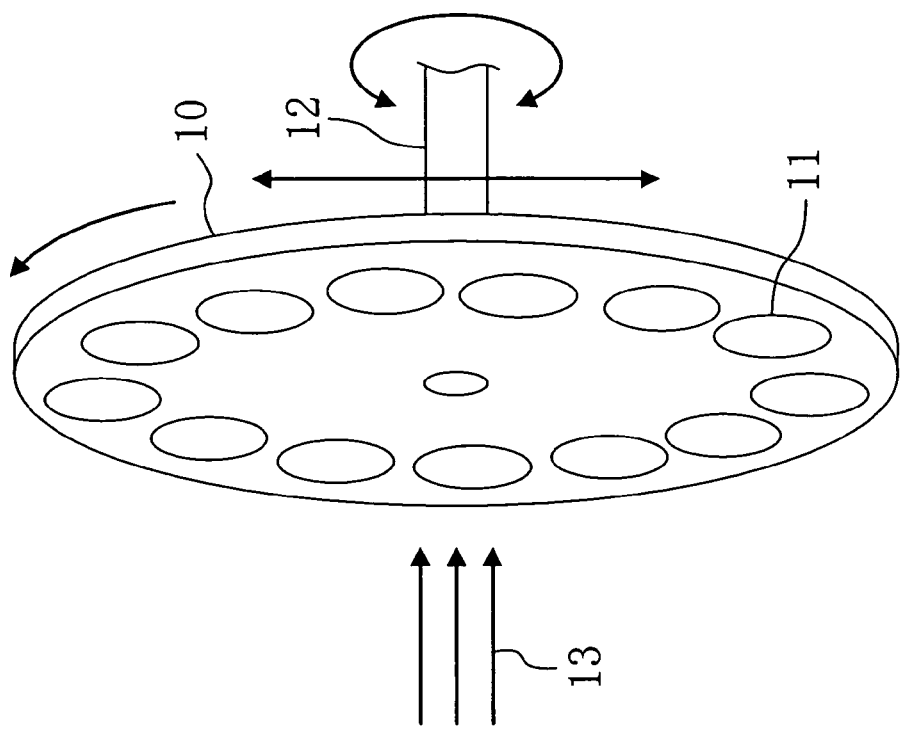
FIGS. 4A and 4B are diagrams illustrating an end station part of an ion implantation apparatus used for a known substrate processing method and how the end station part works.
Figure 4A:
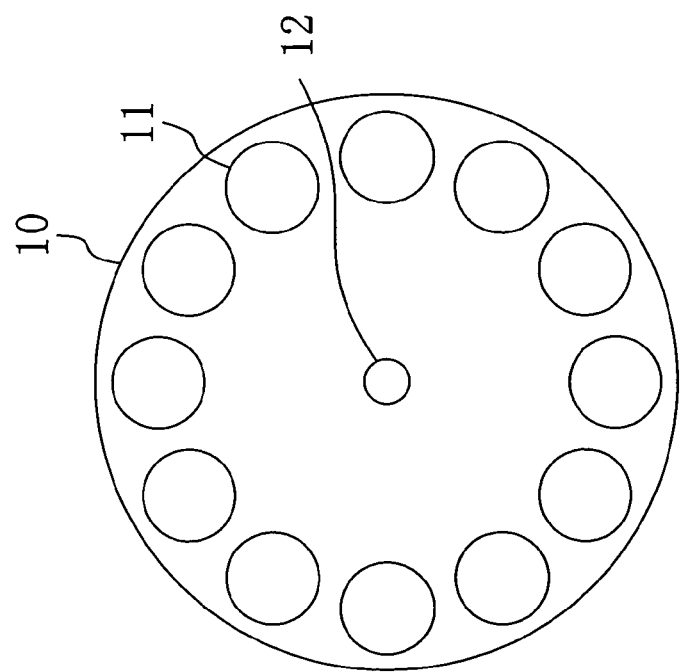
Figure 5B:
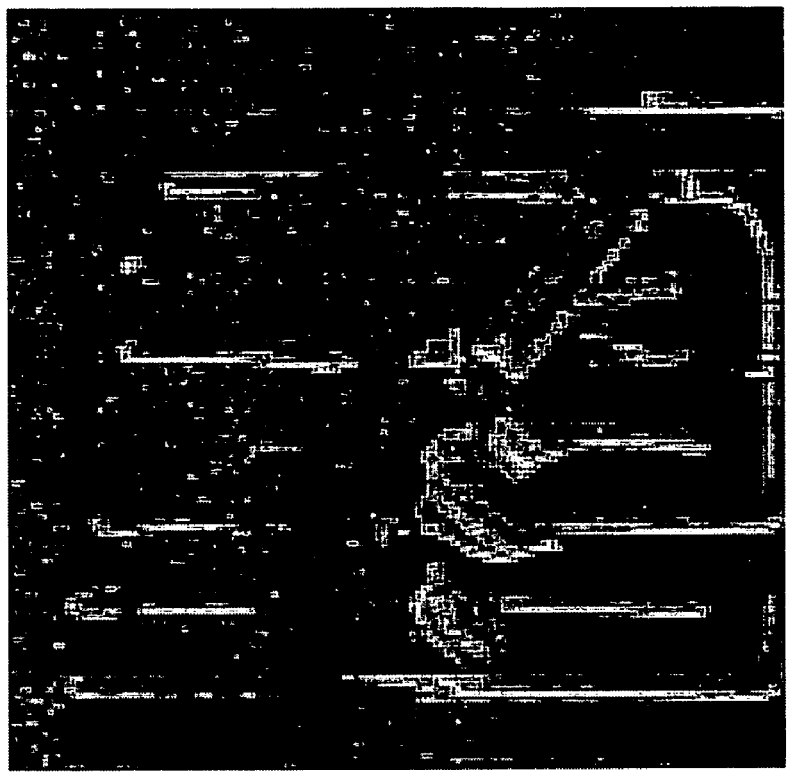
FIGS. 5A and 5B are SEM photographs illustrating damage caused at a substrate according to the present inventors' survey.
Figure 5A:
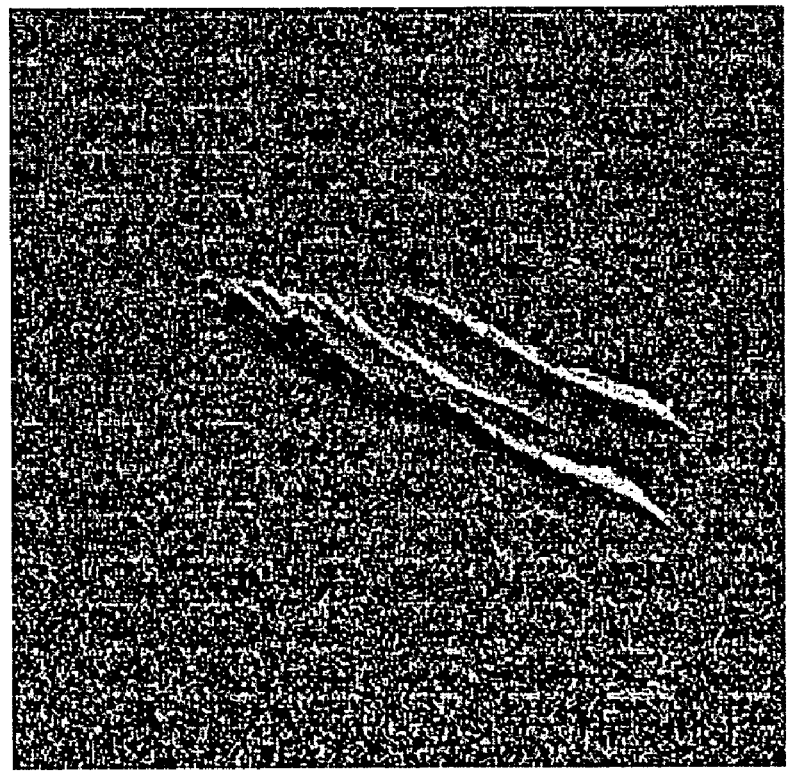
Figure 6A:
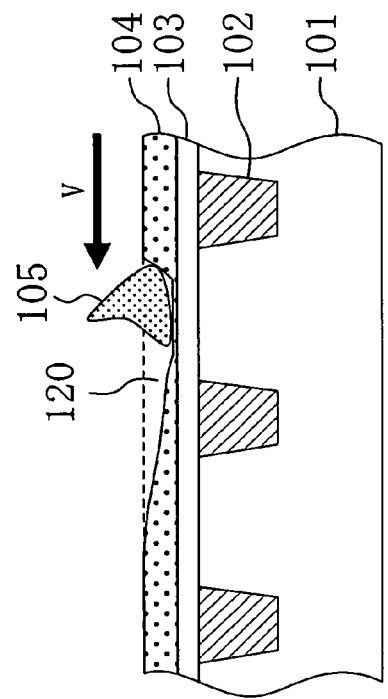
FIGS. 6A through 6D are diagrams for explaining the process of causing the damage illustrated in FIGS. 5A and 5B according to the present inventors' survey.
Figure 6B:
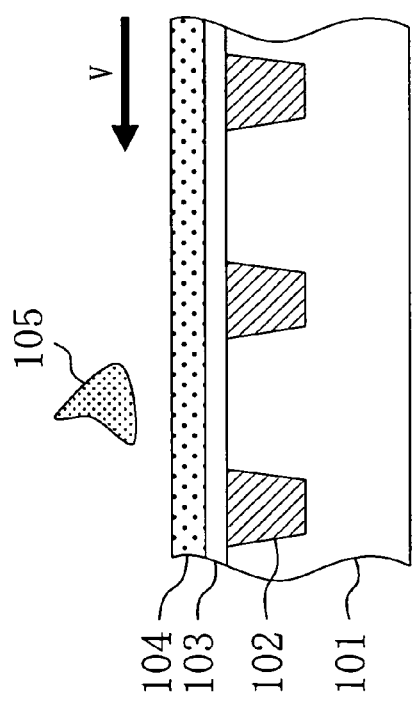
Figure 6C:
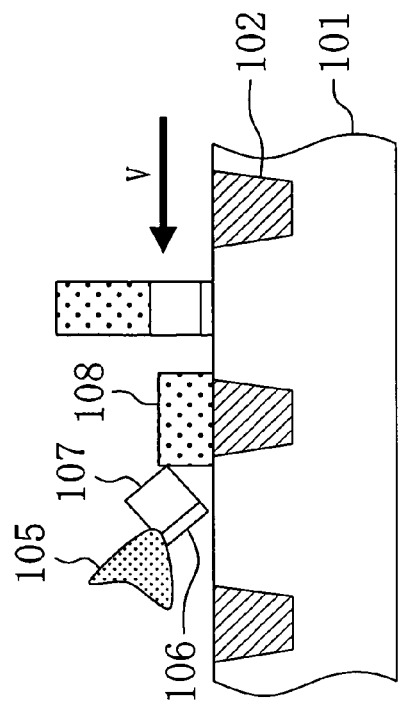
Figure 6D:
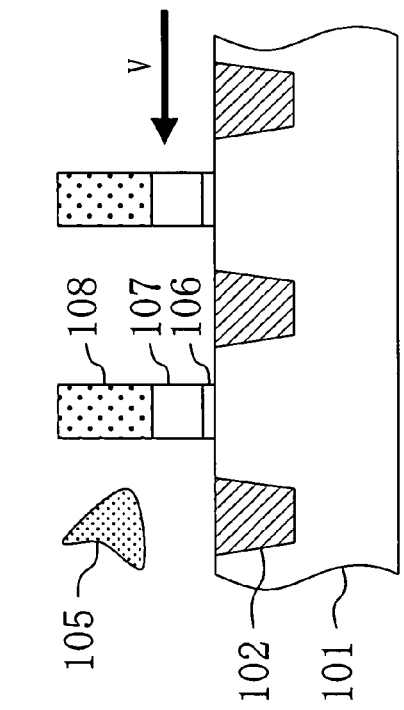

FIG. 3 shows a result of an experiment of ion implantation in this embodiment wherein the uniformity in the dose of ions over the plane of a semiconductor wafer (substrate 201) is measured for different rotational speeds of the disk 200 in the range of 200 to 1200 rpm. In this embodiment, an axis of abscissas in FIG. 3 represents the distance from the center of the semiconductor wafer in millimeters, wherein the center of the semiconductor wafer is 0, the distance from the center thereof in one of the directions of the radii of the semiconductor wafer is represented by positive values, and the distance therefrom in the opposite direction is represented by negative values. An axis of ordinates relatively represents the doses of an impurity at locations over the semiconductor wafer.

In FIG. 3, σ described for each rpm represents the nonuniformity of the dose of an impurity and is preferably 0.5% or less.

As illustrated in FIG. 3, when the rpm of the disk 200 is 250 or less, the dose of an impurity significantly varies over the semiconductor wafer plane. In view of the above, when the velocity at which the substrate 201 moves (hereinafter, referred to as "substrate moving velocity") becomes smaller than a fixed lower limit, this worsens the uniformity of a process over the semiconductor wafer plane (in this embodiment, the uniformity of the dose).

In view of the above, the lower limit of the substrate moving velocity can be determined based on the above result. In other words, the above result can exhibit the substrate moving velocity that can restrain the uniformity of the dose of an impurity over the semiconductor wafer plane from becoming worse. To be specific, when the substrate moving velocity is calculated in terms of the linear velocity of the semiconductor wafer relative to the vacuum atmosphere, the linear velocity thereof need be 10 m/second or more.

In view of the above, when in ion implantation the velocity at which a semiconductor wafer (substrate 201) moves relative to the vacuum atmosphere is 10 m/second through 30 m/second both inclusive, this can suppress both the production of defects caused by the collision of minute particles and the worsening of the uniformity of the dose of an impurity. However, this is limited to the case where a 0.13-μm-wide gate electrode pattern is formed on a substrate.

For an opening-type pattern obtained by forming openings, such as contact holes, in a film, even when the size of each opening is reduced, the film forming a pattern has a very large area. This insignificantly affects defects caused by the collision of minute particles. However, when a pattern obtained by leaving part of a film in form of islands, such as a pattern of gate electrodes, becomes finer, the collision of minute particles significantly affects the production of defects.

As previously mentioned, when an island-like pattern is formed on a substrate 201 to have a minimum pattern width of 0.13 μm, the relative velocity of the substrate 201 to the vacuum atmosphere is preferably 10 m/second through 30 m/second both inclusive. However, when the pattern has a different minimum pattern width, the appropriate relative velocity varies depending on the minimum pattern width.

The same experiment as described in this embodiment shows the following results. First, when the minimum pattern width is 0.13 μm or less, the relative velocity of the substrate to the vacuum atmosphere is preferably 10 m/second through 30 m/second both inclusive and more preferably 20 m/second through 30 m/second both inclusive.

Furthermore, when the minimum pattern width is larger than 0.13 μm and equal to or smaller than 0.2 μm, the relative velocity of the substrate is preferably 10 m/second through 34 m/second both inclusive and more preferably 20 m/second through 34 m/second.

In addition, when the minimum pattern width is larger than 0.2 μm and equal to or smaller than 1.5 μm, the relative velocity of the substrate is preferably 5 m/second through 50 m/second both inclusive.

In the above description, batch-type ion implantation is carried out while the substrate 201 is moved with the rotation and up-and-down movements of the disk 200. However, this is not restrictive. In other words, process steps in which the substrate 201 is processed with the substrate 201 moved include not only ion implantation but also other process steps, and the substrate processing method of this embodiment can be applied to these process steps. These process steps include those using (a) an apparatus for inspecting the top surface of a semiconductor substrate for dust, (b) a wafer cleaner after chemical mechanical polishing (CMP), (c) a coater used in a photolithography process step, (d) a scrubber cleaner, (e) a batch-type spin cleaner/dryer, and other apparatuses. Such process steps will be described below.

The apparatuses (a) through (d) are usually of a single-wafer type and perform corresponding process steps while rotating, at high speed, a circular semiconductor substrate or the like about the vicinity of an axis of rotational symmetry of the semiconductor substrate or the like. In particular, the rpm of the scrubber cleaner (d) conventionally exceeds 4000. For this reason, when a wafer having a large diameter of 300 mm is processed which has come to be widely used, the relative velocity of, in particular, the outer edge of the wafer becomes higher than the other part thereof and far exceeds 30 m/second when calculated in terms of the linear velocity.

In the case of the batch-type spin cleaner/dryer (e), a plurality of wafers are contained in each of a plurality of cassettes, and the cassettes are centrosymmetrically arranged on a rotating table. The wafers are cleaned using a chemical solution or dried while the rotating table is rotated at high speed.

In the case of ion implantation, the processing atmosphere around a substrate is a high vacuum atmosphere during this process step but may be any other processing atmosphere. It is, for example, air in the apparatuses (a) and (c), a gaseous atmosphere, such as $N_2$, in the apparatus (e), and a liquid atmosphere, such as pure water or a chemical solution, in the cleaners (b), (d) and (e).

Since liquid or gas flows unlike the case where the atmosphere is a vacuum, the relative velocity of a substrate to an atmosphere is not necessarily identical with the relative velocity of the substrate to a container for processing the substrate. Pattern defects are produced according to the relative velocity of the substrate to particles existing in the atmosphere. Therefore, the upper and lower limits of the substrate moving velocity are determined based on the relative velocity of the substrate to the atmosphere.

Also in process steps using the above apparatuses (a) through (e), minute particles may be contained in the processing atmosphere around the substrate like the case of ion implantation. In this case, minute particles in gas or liquid collide with a pattern formed on the substrate during the process steps, leading to the destroyed pattern.

On the other hand, as described in this embodiment, when the substrate moving velocity during the process steps is set at a predetermined upper limit or less, this can suppress the destruction of the pattern and reduce the number or density of defects to an allowable upper limit or less.

Furthermore, in some cases, reduction in the substrate moving velocity during the process steps using the apparatuses (a) through (e) also leads to the worsened uniformity of the process steps over the substrate. To cope with this, the lower limit of the substrate moving velocity that provides allowable uniformity is previously determined, and then the substrate moving velocity is set at the lower limit or more in the process steps.

For the range of relative velocities of the substrate, more specifically, the relationship between the minimum pattern width and the range of relative velocities of the substrate, which was described for the case of ion implantation, can be applied also to the process steps using the apparatuses (a) through (e). It is possible as a matter of course to determine conditions (the upper and lower limits of the relative velocity) corresponding to the individual process steps, for example, by associated experiments. In the case where there is only a demand for the suppression of defects produced at the substrate, only the upper limit of the relative velocity need be set.

In addition to the above description, a substrate may be moved by rotating the substrate about its axis of rotational symmetry like the single-wafer type apparatuses (a) through (d). Also in such a case, a pattern formed at the top surface of the substrate and minute particles existing in a processing atmosphere move relative to each other. This allows the particles to collide with the substrate, leading to the possibility that defects may be produced in the pattern formed at the substrate. This provides the effect of the present invention in which the production of pattern defects is suppressed by setting the substrate moving velocity.

In view of the above, the substrate processing method of this embodiment can suppress the production of pattern defects due to particles by setting the substrate moving velocity in a process for the substrate at a predetermined upper limit or less and restrain the worsening of the uniformity of the process over the substrate by setting the substrate moving velocity at a predetermined lower limit or more.

What is claimed is:

1. A substrate processing method comprising the steps of placing a substrate inside a vacuum container containing particles, and processing the substrate inside the container while moving the substrate at a predetermined relative velocity of the substrate to the container, wherein an allowable upper limit of the number or density of defects is determined, said defects being produced at the substrate due to the particles in the process for the substrate, and the predetermined relative velocity is set at a value equal to or smaller than the relative velocity obtained when the number or density of defects reaches the upper limit.

2. The substrate processing method of claim 1, wherein the container is a processing container for an ion implantation apparatus, and the process is ion implantation.

3. The substrate processing method of claim 1, wherein an allowable lower limit of the uniformity of the process over the substrate is determined, and the predetermined relative velocity is set at a value equal to or larger than the relative velocity obtained when the uniformity reaches the lower limit.

4. The substrate processing method of claim 1, wherein an island-like pattern is formed on the substrate to have a minimum pattern width larger than 0.2 μm and equal to or smaller than 1.5 μm, and the relative velocity is 5 m/second through 50 m/second both inclusive.

5. The substrate processing method of claim 1, wherein
an island-like pattern is formed on the substrate to have a minimum pattern width larger than 0.13 μm and equal to or smaller than 0.2 μm, and
the relative velocity is 10 m/second through 34 m/second both inclusive.

6. The substrate processing method of claim 1, wherein
an island-like pattern is formed on the substrate to have a minimum pattern width of 0.13 μm or less, and
the relative velocity is 10 m/second through 30 m/second both inclusive.

7. A substrate processing method comprising the steps of
placing a substrate in an atmosphere containing particles, said atmosphere being for processing the substrate, and
processing the substrate in the atmosphere while moving the substrate at a predetermined relative velocity of the substrate to the atmosphere,
wherein an allowable upper limit of the number or density of defects is determined, said defects being produced at the substrate due to the particle in the process for the substrate, and
the predetermined relative velocity is set at a value equal to or smaller than the relative velocity obtained when the number or density of defects reaches the upper limit.

8. The substrate processing method of claim 7, wherein
the atmosphere is gas.

9. The substrate processing method of claim 8, wherein
the process for the substrate is drying.

10. The substrate processing method of claim 7, wherein
the atmosphere is liquid.

11. The substrate processing method of claim 10, wherein
the process for the substrate is cleaning.

12. The substrate processing method of claim 10, wherein
the process for the substrate is application of liquid onto the substrate.

13. The substrate processing method of claim 7, wherein
an allowable lower limit of the uniformity of the process over the substrate is determined, and
the predetermined relative velocity is set at a value equal to or larger than the relative velocity obtained when the uniformity reaches the lower limit.

14. The substrate processing method of claim 7, wherein
an island-like pattern is formed on the substrate to have a minimum pattern width larger than 0.2 μm and equal to or smaller than 1.5 μm, and
the relative velocity is 5 m/second through 50 m/second both inclusive.

15. The substrate processing method of claim 7, wherein
an island-like pattern is formed on the substrate to have a minimum pattern width larger than 0.13 μm and equal to or smaller than 0.2 μm, and
the relative velocity is 10 m/second through 34 m/second both inclusive.

16. The substrate processing method of claim 7, wherein
an island-like pattern is formed on the substrate to have a minimum pattern width of 0.13 μm or less, and
the relative velocity is 10 m/second through 30 m/second both inclusive.

* * * * *